(12) United States Patent
Akatsu et al.

(10) Patent No.: US 7,232,488 B2
(45) Date of Patent: Jun. 19, 2007

(54) METHOD OF FABRICATION OF A SUBSTRATE FOR AN EPITAXIAL GROWTH

(75) Inventors: Takeshi Akatsu, St. Nazaire les Eymes (FR); Cecile Aulnette, Grenoble (FR); Bruno Ghyselen, Seyssinet (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 201 days.

(21) Appl. No.: 10/827,437

(22) Filed: Apr. 20, 2004

(65) Prior Publication Data
US 2005/0066886 A1    Mar. 31, 2005

(30) Foreign Application Priority Data
Sep. 26, 2003    (EP)    ................... 03292377

(51) Int. Cl.
*C30B 25/04* (2006.01)
(52) U.S. Cl. ............ 117/94; 117/95; 117/89; 117/91; 117/915; 117/930
(58) Field of Classification Search ............ 117/94, 117/95, 915, 930, 89, 91
See application file for complete search history.

(56) References Cited

U.S. PATENT DOCUMENTS

| | | | |
|---|---|---|---|
| 5,362,682 A * | 11/1994 | Bozler et al. .............. 438/458 |
| 6,039,803 A | 3/2000 | Fitzgerald et al. ............ 117/89 |
| 6,464,780 B1 | 10/2002 | Mantl et al. ................. 117/90 |
| 6,497,763 B2 * | 12/2002 | Kub et al. .................... 117/94 |
| 6,524,935 B1 | 2/2003 | Canaperi et al. ............ 438/478 |
| 6,540,827 B1 * | 4/2003 | Levy et al. .................... 117/3 |
| 6,641,662 B2 * | 11/2003 | Radojevic et al. ............ 117/2 |
| 2001/0003269 A1 * | 6/2001 | Wu et al. ..................... 117/94 |

FOREIGN PATENT DOCUMENTS

EP    1 258 544 A1    11/2002
WO    WO 03/009366 A1    1/2003

OTHER PUBLICATIONS

L. Huang et al., XP001116664 "Electron And Hole Mobility Enhancement In Strained SOI By Wafer Bonding", IEEE Transactions On Electron Devices, vol. 49, No. 9, pp. 1566-1567 (2002).
L. Huang et al., XP001020601, "Sige-On-Insulator Prepared By Wafer Bonding And Layer Transfer For High-Performance Field-Effect Transistor", Applied Physics Letters, American Institute Of Physics, vol. 78, No. 9, pp. 1267-1269, (2001).
C. Maleville et al., XP-001003462, "Multiple SOI Layers By Multiple Smart-Cut Transfers", 2000 IEEE International SOI Conference, pp. 134-135, (2000).

* cited by examiner

*Primary Examiner*—Robert Kunemund
(74) *Attorney, Agent, or Firm*—Winston & Strawn LLP

(57) ABSTRACT

The present invention relates to a method of fabrication of a substrate for an epitaxial growth. A relaxed epitaxial base layer is obtained on an auxiliary substrate. The invention allows the fabrication of substrates with a more efficient epitaxial growth of a material with a desired lattice parameter on another material with a different lattice parameter. The material can be grown with a high thermodynamic and crystallographic stability. At least a part of the epitaxial base layer is transferred onto a carrier substrate, forming a base substrate, and growing the material of the epitaxial base layer is further grown on the carrier substrate.

20 Claims, 2 Drawing Sheets

METHOD OF FABRICATION OF A SUBSTRATE FOR AN EPITAXIAL GROWTH

FIELD OF THE INVENTION

The present invention relates to a method of fabrication of a substrate for an epitaxial growth, and more particularly to a method of making a substrate for epitaxial growth in which a relaxed epitaxial base layer is obtained on an auxiliary substrate is obtained.

BACKGROUND OF THE INVENTION

U.S. Pat. No. 6,039,803 describes a GeSi layer that is grown epitaxially on a silicon substrate having a lattice constant different from the GeSi layer. First, a graded buffer GeSi layer is formed on the silicon substrate, serving as lattice adaptation between the silicon substrate and a relaxed GeSi layer formed on the graded buffer GeSi layer. This method results in a high quality epitaxial GeSi layer but it is difficult and very time consuming, leading to high costs of the produced GeSi layers. Thus, these layers are often only applied in very specific instances, despite their excellent electronic properties. Thus, improvements in providing such GiSe layers are desired, and these are now provided by the present invention.

SUMMARY OF THE INVENTION

The present invention relates to a method for producing a substrate for conducting epitaxial growth thereon. In the preferred embodiment, the method comprises obtaining a substantially relaxed epitaxial base layer on an auxiliary substrate; transferring at least a portion of the epitaxial base layer onto a carrier substrate to provide a base substrate; and increasing the thickness of the transferred epitaxial base layer portion on the carrier substrate by epitaxial growth to form an epitaxial base layer thereon while maintaining a high degree of thermodynamic and crystallographic stability of the grown epitaxial base layer.

The epitaxial base layer is preferably made of first material, and the thickness of the epitaxial base layer is increased by epitaxially growing an additional thickness of the first material to provide the further grown portion on the carrier substrate. The first thickness of the epitaxial base layer is grown to about 0.1 µm to about 5 µm. Preferably, the materials of the different layers and substrates are selected such that the epitaxial base layer is lattice-mismatched with the auxiliary substrate. The preferred relaxed epitaxial base layer is obtained on the auxiliary substrate by epitaxially growing this layer to a thickness of about between 0.1 µm and 5 µm prior to transfer.

In the preferred embodiment, at least a portion of the epitaxial base layer is transferred onto the carrier substrate by implanting atomic species in the base of epitaxial layer to form a weakened zone to define the portion of the epitaxial base layer to be transferred, bonding the implanted epitaxial base layer with the carrier substrate, and detaching the bonded structured at the weakened zone. The carrier substrate is preferably made of silicon, silicon dioxide, fused silica, oxidised silicon, germanium, gallium nitride, indium phosphide, or gallium arsenide. The base substrate can be thermally treated after the transfer of the portion of the epitaxial base layer. An operation can be conducted on the surface of the epitaxial base layer after the transfer thereof to improve the surface condition of the epitaxial base layer for further epitaxial growth.

Preferably, the further grown portion of the epitaxial base layer has a dislocation density that is lower than that of the epitaxial base layer of the auxiliary substrate. Also, the portion of the epitaxial base layer that is transferred to the carrier substrate preferably has a dislocation density that is lower than that of the epitaxial base layer remaining on the auxiliary substrate. The average dislocation density of the transferred portion is also lower than the average dislocation density prior to the transfer.

The further grown portion of the epitaxial base layer is preferably grown epitaxially to a thickness about 0.1 µm and 5 µm and preferably comprises silicon germanium. The further grown portion can be transferred to another substrate to form a composite structure. Additionally, the further grown portion preferably includes a second portion that remains, for example, associated with the carrier substrate, after the transfer of the first portion to the other substrate, and the preferred method includes transferring the second portion to a further substrate. The second portion can be reclaimed or planarised prior to the transfer thereof to improve its bonding to the further substrate.

At least one second epitaxial layer can be grown on the further grown portion that is associated with the carrier substrate, and this second epitaxial layer is preferably made of silicon. A preferred thickness of the second epitaxial layer is about between 10 nm and 20 nm. Most preferably, another epitaxial base layer is grown on the second epitaxial layer, and the two epitaxial base layers are preferably made of the same material. Another epitaxial base layer can be grown to provide a repeating structure of layers of materials arranged in an alternating sequence of alternating layer characteristics and types. At least a portion of the epitaxial base layer can be transferred together with at least a portion of the second epitaxial layer to another substrate. Additionally, a finishing process may be conducted the surface of the epitaxial base layer that is transferred to another substrate.

The invention thus provides a method of making substrates that allow an efficient epitaxial growth of a material with a different lattice parameter than the material in which it is grown, while maintaining a high degree of thermodynamic and crystallographic stability.

BRIEF DESCRIPTION OF THE DRAWINGS

Specific embodiments of the present invention will become more apparent from the following detailed description with reference to the accompanying drawings, in which.

DETAILED DESCRIPTION OF THE PREFERRED EMBODIMENTS

Figure 1:
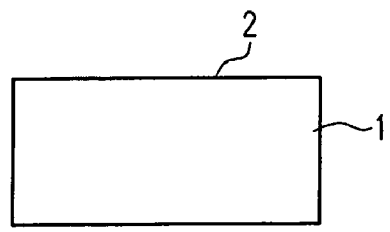
FIG. 1 chemically shows a source substrate.

The present invention provides for fabrication of substrates that allow for more efficient epitaxial growth of a first material, which has a desired lattice parameter, on another material, that has a different lattice parameter. The first material is advantageously grown with a high thermodynamic and crystallographic stability. A method is provided that can include transferring at least a part of the epitaxial base layer onto a carrier substrate to form a base substrate; and further growing of the material of the epitaxial base layer on the carrier substrate.

In the transferring step, at least a part of the epitaxial layer is detached from the auxiliary substrate and transferred onto the carrier substrate. Surprisingly, during and after the transfer, the epitaxial base layer maintains a good crystal quality and thermodynamic stability as on the auxiliary substrate. Instead of requiring a difficult and time-consuming material growth on the auxiliary substrate to be performed until a transferable material thickness of the epitaxial base layer is provided, in the invention method the further growth of the epitaxial base layer can be simply performed on the carrier substrate. The carrier substrate can have a simpler or more common structure compared to the complicated and cost-intensive prior art auxiliary substrate. It is therefore possible to grow a thicker epitaxial base layer on the carrier substrate with a quality comparable to the high quality achieved when the epitaxial layer is grown on the auxiliary substrate, but with increased efficiency.

According to a variant of the invention, the relaxed epitaxial base layer can be lattice-mismatched with the auxiliary substrate. In preferred embodiment of the invention, the epitaxial base layer is grown with a thickness of about 0.1 µm to 5 µm on the auxiliary substrate. These lesser thicknesses are surprisingly sufficient for an effective and thermodynamically stable transfer to the carrier substrate.

In an embodiment of the invention, the epitaxial base layer is transferred onto the carrier substrate using the following steps: implanting atomic species in the epitaxial base layer, forming a pre-weakened area; bonding the implanted epitaxial base layer with the carrier substrate; and detaching the bonded structure at the pre-weakened area. The implanting step makes it possible for the pre-weakened area to be formed in an accurate but efficient way. The bonding step allows good adhesion between the epitaxial base layer and the carrier substrate so that at least part of the epitaxial base layer adheres to the carrier substrate when detaching occurs.

It is furthermore advantageous to select the carrier substrate from at least one of the group consisting of silicon, silicon dioxide, fused silica, oxidised silicon, germanium, gallium nitride, indium phosphide and gallium arsenide. This way, the properties of these materials can be combined with the very specific electronic properties of the epitaxial base layer in a crystallographically and thermodynamically stable heteroepitaxial structure.

According to a preferable embodiment of the invention, the base substrate is thermally treated after the transferring step. This method can stabilize the material compound of the epitaxial base layer and the carrier substrate and/or reduce defects which may be caused during the transferring step. The thermal treatment can be applied before and/or after the further growing of the epitaxial base layer on the carrier substrate.

In a further example of the invention, a surface of the epitaxial base layer is prepared for epitaxy after the transferring step. This can help to facilitate and to improve a subsequent epitaxial growth on the transferred epitaxial base layer. A preparation for epitaxy can be performed by, for example, chemical-mechanical polishing (CMP), chemically or by planarisation.

It is further advantageous if the further-grown material of the epitaxial layer has less dislocation density than the epitaxial base layer obtained on the auxiliary substrate. This makes the further grown material more suitable for subsequent applications.

According to a further aspect of the present invention, the part of the epitaxial base layer transferred has a smaller dislocation density than the epitaxial base layer grown on the auxiliary substrate. In this way, the quality of the transferred epitaxial base layer is improved and very well suited for further processing.

According to another advantageous embodiment of the invention, the epitaxial base layer is further grown on the carrier substrate up to a thickness of about 0.1 µm to 5 µm. The increased thickness achieved by this method is especially favourable for a detachment of the further-grown epitaxial base layer, making it possible to transfer at least a part of the further-grown epitaxial base layer to another substrate.

In a further embodiment of the invention, the further grown epitaxial base layer is of silicon germanium. A good layer quality can be obtained by the growth of this material.

According to an embodiment of the present invention, at least a part of the material of the epitaxial base layer that is further grown on the carrier substrate is transferred to another substrate, forming a further combined structure. Thus, a part of the epitaxial base layer can be detached and applied to another substrate. By applying this step, epitaxial base layers of good quality can be obtained and can be applied to a desired substrate, forming the further combined structure.

According to a variant of the invention, the transfer of at least a part of the further-grown layer to another substrate can be repeated with the remainder of the further-grown layer on the carrier substrate. With repetition, a good multiplication of an epitaxial base layer of high quality can be attained. It is possible to use the further-grown layer subsequently for detaching parts thereof and applying them to other structures. If desired, the detachment can be carried out by implanting atomic species in the base epitaxial layer, forming a pre-weakened area, a subsequent bonding of the implanted epitaxial base layer, and finally detaching the bonded structure at the pre-weakened area.

A variant of the invention suggests that the transfer can be repeated after re-claiming and/or planarisation of the remaining further-grown layer. This provides a good surface for the later application of the further-grown layer to another substrate.

In a beneficial variant of the invention, at least one second epitaxial layer is grown on the further-grown epitaxial base layer on the carrier substrate. This method can be used to grow a second epitaxial layer on the same carrier substrate with material properties other than those of the base epitaxial layer but with a comparably high crystal quality.

In a yet further preferred embodiment of the invention, the at least one second epitaxial layer is of silicon. Thus it is possible to produce a high quality strained silicon layer on the epitaxial base layer which can be favourably used in certain electronic devices due to the excellent electronic properties of high crystal quality strained silicon.

In an especially favorable embodiment of the invention, the at least one second epitaxial layer is formed with a thickness of about 10 µm to about 20 µm. Thereby a very high degree of strain in the second epitaxial layer can be produced which can lead to an increased carrier mobility in the second epitaxial layer.

In another advantageous example of the invention, a further epitaxial layer of the material of the base epitaxial layer is grown on the second epitaxial layer. This way, the second epitaxial layer can be sandwiched between two epitaxial layers with the same material properties. The second epitaxial layer therefore defines an end of a base epitaxial layer which makes it possible to use the second epitaxial layer in particular as an etch stop for a transfer of at least part of the epitaxial base layer from the carrier substrate to another substrate.

In another beneficial variant of the invention, a periodical structure with alternate epitaxial base layers and at least one second epitaxial layer is formed. This method results in a structure which is especially favourable for a repeated transfer of at least a part of the base epitaxial layer to another substrate, whereas the second epitaxial layer can be helpful for a defined transfer of at least a part of the base epitaxial layer or it can be transferred together with at least a part of the base epitaxial layer to the other substrate.

It is furthermore advantageous when at least a part of the material of the epitaxial base layer is transferred together with at least a part of the second epitaxial layer to the other substrate. This way, not only can the good material characteristics of the epitaxial base layer be transferred to the other substrate, but also the excellent material and electronic properties of the second epitaxial layer can be used at the other substrate.

In another preferred variant of the invention, a surface of the further combined structure is finished. By this method, the surface properties of the resulting structure can be advanced so that the combined structure is very well-prepared for a high variety of further process steps.

FIG. 1 schematically shows a source substrate 1 having a surface 2, used as a starter material for the present invention. The source substrate 1 is a wafer in the embodiment shown, but in other embodiments can be any kind of substrate available in the semiconductor industry, such as a chip or material compound. The first substrate 1 can be already structured of several portions, such as layers, or can be unstructured as shown in FIG. 1, such as with a simple substantially uniform structure. The source substrate 1 is of a single crystalline material such as single crystal silicon, germanium, GeSi or an $A_{III}$-$B_V$ semiconductor. In the embodiment shown, the source substrate 1 is of single crystalline silicon.

Figure 2:
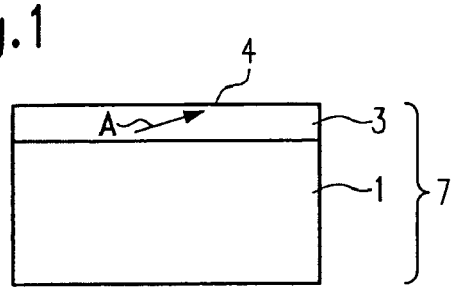
FIG. 2 schematically shows a formation of a graded buffer layer on the source substrate of FIG. 1.

FIG. 2 schematically shows a formation of a graded buffer layer 3 on the surface 2 of the source substrate 1 shown in FIG. 1. The graded buffer layer 3 is epitaxially grown on the source substrate 1 and preferably includes a material with a lattice constant different from a lattice constant of the source substrate 1.

In the embodiment shown, the graded buffer layer 3 consists of GeSi, the germanium content of which is gradually increased, beginning from the source substrate 1 as shown by the arrow A. The graded buffer GeSi layer 3 is grown to have a thickness $t_o$ and has a surface 4. In another embodiment, the source substrate 1 consists of germanium, and the graded buffer layer 3 is GeSi, the germanium content of which is gradually decreased beginning from the source substrate 1. In other examples of the present invention, the material of the buffer layer 3 can be of $Si_{1-x}$, $Ge_x$, $Si_{1-x-y}$, $Ge_xC_y$, $Si_{1-y}C_y$, GaAs, InP, GaN, GaP or other $A_{III}$-$B_V$ materials.

The buffer layer 3 serves as a lattice adaptation layer between the source substrate 1 and an epitaxial layer 5 that will be formed on the buffer layer 3. It is also possible that a so-called "compliant" substrate be used as a starter material for the present invention, instead of the source substrate 1 with the buffer layer 3. Compliant substrates have an implanted region at a certain depth, allowing a slippage effect of a substrate layer above the implanted region in relation to the bulk substrate. This way, a difference between lattice constants of a layer grown on the implanted substrate and the substrate can be absorbed.

In a further example of the present invention, a relaxed layer can be obtained by implantation followed by a heat treatment. This is described in U.S. Pat. No. 6,464,780 B1, the disclosure of which is hereby incorporated in its entirety by reference. This patent teaches producing a mono-crystalline layer on a substrate with a non-adapted lattice. A mono-crystalline layer is deposited upon a surface of a lattice-mismatched mono-crystalline substrate and then a buried defect-rich layer is created in said mono-crystalline substrate. This prevents the development of threading dislocations in mono-crystalline layer by ion implantation, e.g., by hydrogen. The defect-rich layer is preferably found is preferably disposed in the mono-crystalline substrate as close as possible to the surface without disturbing the surface. The mono-crystalline layer is then relaxed and the formation of threading deformations is restricted. The lattice parameters of the mono-crystalline layer come close to the original lattice structure.

Figure 3:
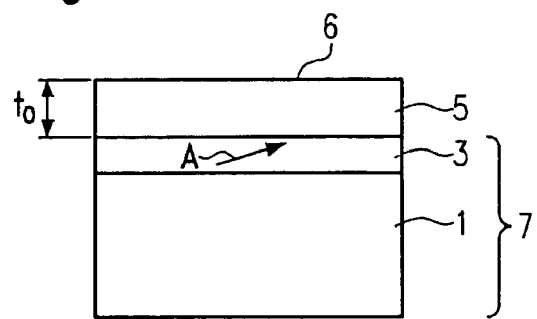
FIG. 3 schematically shows a formation of a relaxed layer on the structure shown in FIG. 2.

The structure shown in FIG. 2 or a compliant substrate is preferably used as an auxiliary substrate 7 for the following process steps. FIG. 3 schematically shows a formation of a relaxed epitaxial GeSi layer 5 on the surface 4 of the graded buffer layer 3 of the structure shown in FIG. 2. The epitaxial layer 5 is grown with a high crystal quality up to a thickness $t_o$ which is large enough to allow a detachment of at least a portion thereof in a later step. In another possible embodiment, the epitaxial layer 5 is grown on a compliant substrate that acts as a lattice adapter.

The process shown in FIGS. 1 to 3 results in a heteroepitaxial structure having on top the relaxed layer 5 with a high thermodynamic and crystallographic stability. To achieve such a result, the above steps are preferably conducted with great care, entailing a relatively long process time to produce the relaxed layer 5. The process for producing a high quality relaxed layer, including depositing a graded buffer, can take at least an hour.

The steps shown in FIGS. 1 to 3 or the steps in which the epitaxial layer 5 is grown on a compliant substrate comprise an initial epitaxial growth of the epitaxial layer 5. Although for fabrication of the epitaxial layer 5 a growth on a buffer layer 3 or on a compliant substrate is described, the formation of the epitaxial layer is not limited to these fabrication methods but can be performed with any other suitable method. The epitaxial layer 5 functions as an epitaxial base layer 5 in the following process steps.

Figure 4:
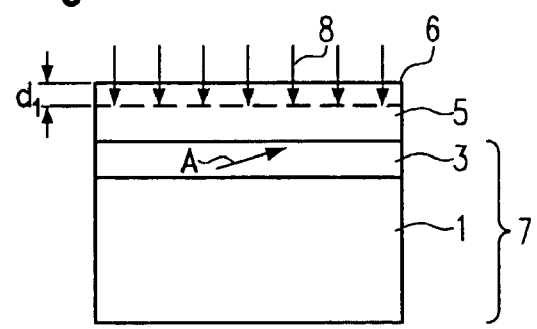
FIG. 4 schematically shows an implantation step performed on the structure of FIG. 3, being a partial stage of a transferring step according to the present invention.

FIG. 4 schematically shows an implantation step performed on the auxiliary substrate 7 shown in FIG. 3. The implantation step represents a partial stage of a transferring step of the present invention used to transfer at least a portion of the high quality grown epitaxial base layer 5 from the complicated auxiliary substrate 7 onto a common carrier substrate 10.

Atomic species 8, such as hydrogen and/or helium ions, are implanted through the surface 6 of the epitaxial base layer 5, forming at a certain depth $d_1$, of the epitaxial base layer 5 a pre-weakened area 9 or a region of weakness. The depth $d_1$, can be in the epitaxial base layer 5 or can be at the interface between the epitaxial base layer 5 and the buffer layer 3. In a variant of the invention, an oxide layer may be formed before the ion implantation.

Figure 5:
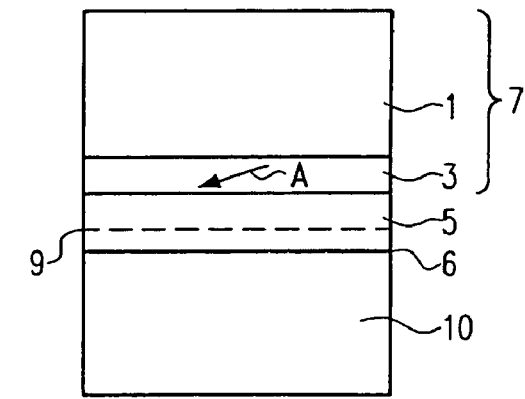
FIG. 5 schematically shows a bonding step of the structure of FIG. 4 with a carrier substrate, being a partial stage of the transferring step according to the present invention.

FIG. 5 schematically shows a bonding step according to a partial stage of the transferring step. The structure shown in FIG. 4 is bonded in this step with a carrier substrate 10 at the implanted surface 6. The carrier substrate 10 can be of a material such as silicon, silicon dioxide, fused silica, oxidised silicon, germanium, gallium nitride, indium phosphide or gallium arsenide. Thereby, the weakened area 9 is disposed near to the bonded interface between the carrier substrate 10 and the implanted auxiliary substrate 7.

Figure 6:
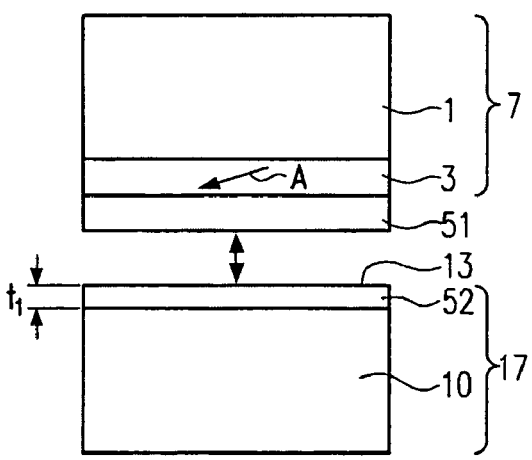
FIG. 6 schematically shows a detaching or splitting step of the structure of FIG. 5, being a partial stage of the transferring step according to the present invention.

FIG. 6 schematically shows the beginning of a detachment step in which the structure shown in FIG. 5 is urged into two parts at the pre-weakened area 9. One of the parts forms a base substrate 17 including 0the carrier substrate 10 and at least a portion 52 of the epitaxial base layer 5. FIG. 6 shows the structure into two parts.

In another embodiment of the invention where the pre-weakened area is formed at the interface between the epitaxial base layer 5 and the buffer layer 3, the structure is urged into two parts at this interface. This way the whole epitaxial base layer can be transferred to the carrier substrate 10. It should be understood for a person skilled in the art that any suitable technique other than that shown in FIGS. 3 to 5 can be used to transfer at least a portion of the epitaxial base layer 5 onto the carrier substrate 10.

After detachment, a surface 13 of the base substrate 17 has an increased roughness. Therefore, the base substrate 17 can be thermally treated to improve the roughness of the surface 13 and/or to increase the bonding force between the epitaxial base layer part 52 and the carrier substrate 10, in a so-called stabilisation process. The thermal treatment can furthermore help to prevent any extension of misfit dislocations or even reduce misfit dislocation density, or other crystalline defects, since it does not contain an unstable structure such as a graded buffer layer.

It also aims at obtaining a surface characteristic which is suitable for a subsequent epitaxial growth. The surface treatment of the surface 13 can be made by Chemical-Mechanical-Polishing (CMP) processes, CMP touch polishing, dry or wet chemical etching and/or annealing steps including rapid thermal annealing (RTA) or rapid thermal oxidation (RTO). The surface 13 can furthermore be treated physically, for example by ion bombardment or by a combination of the above methods.

The finishing of the surface 13 is preferably carried out after the layer transfer shown in FIG. 6, but can likewise be applied after the stabilisation process such as thermal treatment or can be combined with such a stabilisation process. The appropriate step order for finishing depends on the technology and materials used. In a further embodiment, the surface finishing step of the surface 13 can be omitted.

Figure 7:
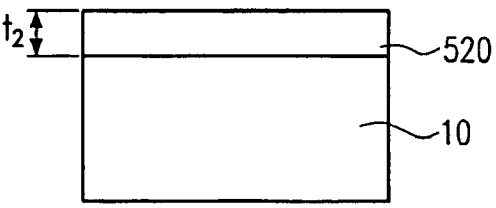
FIG. 7 schematically shows a further growth on a detached or split base substrate of FIG. 6 according to the present invention.

FIG. 7 schematically shows a further epitaxial growth on the structure shown in FIG. 6. In this step, the epitaxial base layer part 52 of FIG. 6, having a thickness $t_1$ after the splitting step, is epitaxially grown up to the thickness $t_2$ of about 0.1 µm to 5 µm, resulting in a thick epitaxial layer 520 on the carrier substrate 10, as shown in FIG. 7.

Surprisingly, the further-grown epitaxial base layer part 520 with the increased thickness $t_2$ has a good high crystal quality and thermodynamic stability like the original epitaxial base layer 5 grown on the auxiliary substrate 7. The further grown epitaxial base layer part 520 has less dislocation density than the epitaxial base layer 5 grown on the auxiliary substrate 7. Furthermore, the part of the epitaxial base layer transferred has a smaller dislocation density than the epitaxial base layer 5 grown on the auxiliary substrate 7.

In the embodiment shown, the further-grown epitaxial base layer part 520 has the same Ge concentration of the GeSi layer 5. A greater thickness $t_2$ is preferable for a further repeated layer transfer, starting from the further-grown epitaxial base layer part 520.

The structure shown in FIG. 7 can be used for a further detachment of a part of the further grown layer 520 and transferring same to another substrate for forming a further combined structure. In this way, and by subsequent transferrals of at least a part of the further grown epitaxial base layer 520, a large number of structures shown in FIG. 7 can be created. Thus, it is possible to repeat the transfer of at least a part of the further-grown layer 520 to another substrate. The remainder of the further-grown layer 520 can be used for transferring at least parts thereof to one or another of the substrates 12. For example, the method described in relation to FIG. 4 for the epitaxial base layer 5, and transferring a part 52 thereof by bonding same to further carrier substrate 10 and detaching same with the method described in FIGS. 4 to 6, can be applied. If a first part of the further-grown layer 520 is transferred, the surface can be re-claimed and/or planarised before remainder of the further-grown layer 520 is transferred.

Figure 8:
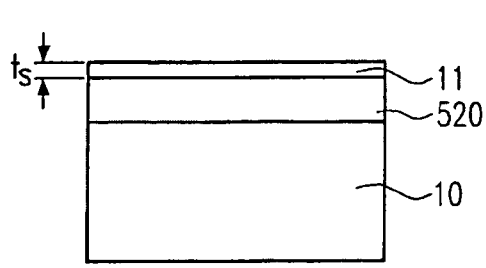
FIG. 8 schematically shows a growth of a second layer on the structure of FIG. 7.

FIG. 8 schematically shows a growth of a second epitaxial layer 11 on the further-grown layer 520. In the embodiment shown, the second epitaxial layer 11 consists of silicon and has a thickness $t_S$ of about 10 nanometres to 20 nanometres. Due to different lattice constants between the second epitaxial layer 11 and the further-grown epitaxial base layer part 520, the second epitaxial layer 11 can be grown on layer 520 with a certain strain. Therefore, in the embodiment shown, a strained silicon layer 11 is formed on the high quality GeSi layer 520.

Figure 9:
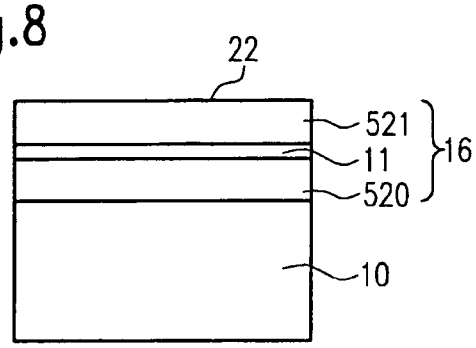
FIG. 9 schematically shows a formation of a periodical structure based on the structure of FIG. 8.

FIG. 9 schematically shows a continued growth of a further epitaxial layer 521 on the second epitaxial layer 11. The further epitaxial layer 521 consists of the same material as the further-grown epitaxial base layer part 520 below the second epitaxial layer 11. Thereby, a periodical structure 16 is formed on the carrier substrate 10, in which the second epitaxial layer 11 is sandwiched between the further-grown epitaxial base layer part 520 and the further epitaxial layer 521. In the embodiment shown, the thin strained silicon layer 11 is sandwiched between the relaxed GeSi layers 520, 521, wherein the strained layer 11 is elastically strained with a very low defect density.

Although not shown, the periodical structure 16 can comprise much more than the layers shown in FIG. 9 with a repeated arrangement of base epitaxial layers 520, 521 and second epitaxial layers 11. Using such a construction, each one or two or more periodicities may be transferred to another substrate. This way, many further combined structures can be produced, all having very good crystallinity comparable with the quality of the originally grown base epitaxial layer 5 grown on the auxiliary substrate 7. The repeated transfer allows therefore a cloning of the epitaxial base layers and/or the second epitaxial layer 11 on a variety of substrates.

Figure 10:
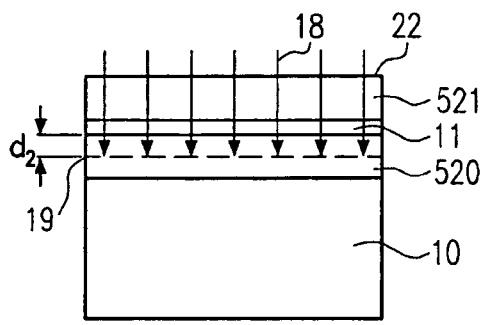
FIG. 10 schematically shows an implantation step performed on the structure of FIG. 9.

FIG. 10 schematically shows an implantation step performed on the structure shown in FIG. 9. Species 18, such as hydrogen or helium ions, are implanted through a surface 22 of the further epitaxial layer 521, through the layer 521, through the second epitaxial layer 11 and to a certain depth $d_2$ of the further-grown epitaxial base layer part 520. The implanted species form there a pre-weakened area 19 defining a later detachment line of the structure.

The next steps are similar to those shown in FIGS. 5 and 6. First, the implanted structure shown in FIG. 10 is bonded at its implanted surface 22 with another substrate 12. The other substrate 12 is, for instance, silicon, silicon dioxide or gallium arsenide, but can be of any other material available in the semiconductor industry.

Figure 11:
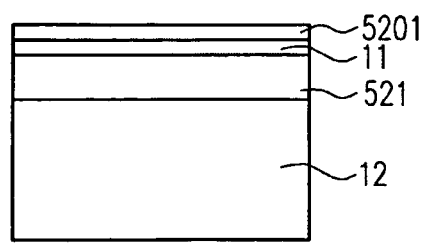
FIG. 11 schematically shows a split part of the structure of FIG. 10 transferred to another substrate.

Then the bonded structure that includes the structure shown in FIG. 10 and the other substrate 12 is detached along the pre-weakened area 19, producing in two parts. FIG. 11 shows one of the parts, comprising the other substrate 12, the further epitaxial layer 521, the second epitaxial layer 11, and at least a part of the further-grown epitaxial base layer part 5201.

Figure 12:
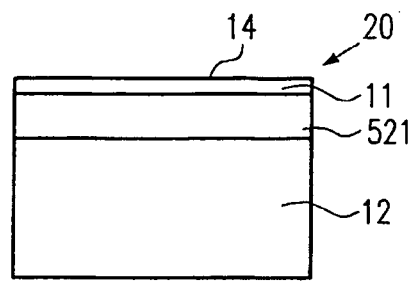
FIG. 12 schematically shows the structure of FIG. 11 after an etching step.

FIG. 12 schematically shows a combined structure 20, which corresponds to the structure shown in FIG. 11 after an etching step in which the residual part 5201 of the epitaxial base layer part 520 is etched away. In the etching step, the second epitaxial layer 11 serves as an etch stop layer causing stopping of etching at the surface 14 of the second epitaxial layer 11. The etching step results in a structure consisting of the other substrate 12, the further epitaxial layer 521 which has a very high degree of crystal quality and thermodynamic stability and the second epitaxial layer 11 which is, in the embodiment shown, a thin, strained silicon layer with a high degree of crystal quality.

Figure 13:
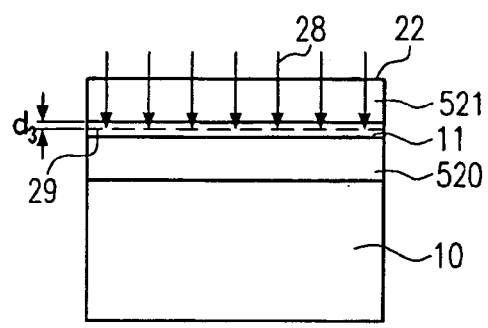
FIG. 13 schematically shows another implantation step performed on the structure of FIG. 9.

FIG. 13 schematically shows a further variant of an implantation step performed on the structure shown in FIG. 9. Species 28, such as hydrogen and/or helium ions, are implanted through the surface 22 of the further epitaxial layer 521, through the further epitaxial layer 521, to a certain depth $d_3$ of the second epitaxial layer 11, forming there a pre-weakened area 29. The next steps for obtaining a detachment at said pre-weakened area 29 are similar to those shown in FIGS. 5 and 6.

First, the structure shown in FIG. 13 is bonded with another substrate 12, comprises, for example, silicon, silicon dioxide or gallium arsenide, but which can be of any other material available in the semiconductor industry. The bonding interface is at the former implanted surface 22. Then, the bonded structure is detached along the pre-weakened area 29, resulting in two parts.

Figure 14:
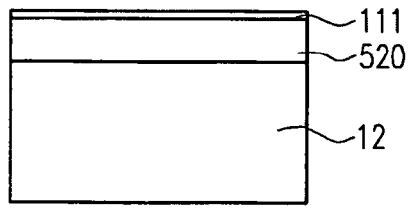
FIG. 14 schematically shows a split part of the structure of FIG. 13 transferred to another substrate.
Figure 15:
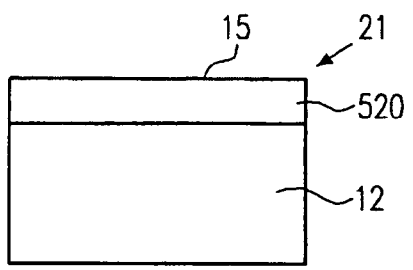
FIG. 15 schematically shows the structure of FIG. 14 after an etching step.

FIG. 14 shows one of these parts, comprising the other substrate 12, the further-grown epitaxial base layer part 520 and a residual part 111 of the former second layer 11. FIG. 15 shows the structure of FIG. 14 after an etching step, in which the residual part 111 of the former second epitaxial layer 11 is removed, wherein the interface between the further-grown epitaxial base layer part 520 and the layer 111 is used as an etch stop. The structure shown in FIG. 15 is a combined structure 21 having a surface 15 with an increased roughness.

The roughness of surface 15 can be reduced in a final finishing step. For final surface treatment, the surface 15 can be planarised, for example, by CMP processes or CMP touch polishing, or by other chemical or physical treatments as mentioned above with reference to the finishing of the surface 13.

While illustrative embodiments of the invention are disclosed herein, it will be appreciated that numerous modifications and other embodiments may be devised by those skilled in the art. Therefore, it will be understood that the appended claims are intended to cover all such modifications and embodiments that come within the spirit and scope of the present invention.

What is claimed is:

1. A method of producing a substrate for conducting epitaxial growth thereon, which comprises:
   obtaining a substantially relaxed epitaxial base layer on an auxiliary substrate;
   transferring at least a portion of the substantially-relaxed epitaxial base layer onto a carrier substrate to provide a base substrate;
   increasing the thickness of the transferred epitaxial base layer portion transferred to the carrier substrate by epitaxial growth to form a further-grown epitaxial base layer thereon while maintaining a high degree of thermodynamic and crystallographic stability of the further-grown epitaxial base layer; and
   transferring a portion of the further-grown epitaxial base layer from the carrier substrate to another substrate.

2. The method of claim 1, wherein the further-grown epitaxial base layer is made of a first material, and its thickness is about 0.1 μm to about 5 μm.

3. The method of claim 1, wherein the substantially-relaxed epitaxial base layer is lattice-mismatched with the auxiliary substrate.

4. The method of claim 1, wherein at least a portion of the substantially-relaxed epitaxial base layer is transferred to the carrier substrate by:
   implanting atomic species in the epitaxial base layer to form weakened zone to define the portion to be transferred;
   bonding the implanted epitaxial base layer with the carrier substrate; and
   detaching the bonded portion of the epitaxial base layer at the weakened zone to transfer it to the carrier substrate.

5. The method of claim 1, wherein the carrier substrate is made of silicon, silicon dioxide, fused silica, oxidised silicon, germanium, gallium nitride, indium phosphide, or gallium arsenide.

6. The method of claim 1, further comprising thermally treating the transferred portion of the epitaxial base layer prior to the further epitaxial growth thereon.

7. The method of claim 1, further comprising conducting an operation on a surface of the transferred portion of the epitaxial base layer for improving surface conditions of the transferred epitaxial base layer portion prior to the further epitaxial growth thereon.

8. The method of claim 1, wherein the epitaxial base layer portion that is transferred has a first dislocation density, and the epitaxial base layer that is further grown on the carrier substrate has a dislocation density that is lower than the first dislocation density.

9. The method of claim 1, wherein the transfer of the portion of the substantially-relaxed epitaxial base layer from the auxiliary substrate to the carrier substrate is conducted in a manner to provide a dislocation density in the transferred portion that is lower than that of the epitaxial base layer on the auxiliary substrate.

10. The method of claim 1, wherein the further grown portion of the epitaxial base layer comprises silicon germanium.

11. The method of claim 1, which further comprises transferring one or more additional portions of the further-grown epitaxial base layer from the carrier substrate to one or more further substrates.

12. The method of claim 11, which further comprises at least one of re-claiming and planarizing the second portion.

13. A method of producing a substrate for conducting epitaxial growth thereon, which comprises:
 obtaining a substantially relaxed epitaxial base layer on an auxiliary substrate;
 transferring at least a portion of the substantially-relaxed epitaxial base layer onto a carrier substrate to provide a base substrate;
 increasing the thickness of the transferred epitaxial base layer portion on the carrier substrate by epitaxial growth to form a further-grown epitaxial base layer thereon while maintaining a high degree of thermodynamic and crystallographic stability of the grown epitaxial base layer;
 growing at least one second epitaxial layer on the further grown portion that is associated with the carrier substrate; and
 transferring a combination of at least a portion of the epitaxial base layer together with at least a portion of the second epitaxial layer to another substrate.

14. The method of claim 13, wherein the at least one second epitaxial layer comprises silicon.

15. The method of claim 13, wherein the at least one second epitaxial layer has a thickness of about 10 nm to about 20 nm.

16. A method of producing a substrate for conducting epitaxial growth thereon, which comprises:
 obtaining a substantially relaxed epitaxial base layer on an auxiliary substrate;
 transferring at least a portion of the substantially-relaxed epitaxial base layer onto a carrier substrate to provide a base substrate;
 increasing the thickness of the transferred epitaxial base layer portion on the carrier substrate by epitaxial growth to form a further-grown epitaxial base layer thereon while maintaining a high degree of thermodynamic and crystallographic stability of the grown epitaxial base layer;
 growing at least one second epitaxial layer on the further grown portion that is associated with the carrier substrate;
 growing an additional epitaxial base layer of the same material as the transferred epitaxial base layer on the second epitaxial layer; and
 transferring a combination of at least a portion of the additional epitaxial base layer together with at least a portion of the second epitaxial layer and together with at least a portion of the epitaxial base layer to another substrate.

17. The method of claim 16, wherein the second epitaxial layer is made of a different material from the transferred epitaxial base layer, and the additional epitaxial base layer is grown to provide a repeating structure with layers of materials arranged in an alternating sequence.

18. The method of claim 14, further comprising finishing a surface of the transferred combination to enhance its surface properties.

19. The method of claim 10 wherein the substantially relaxed epitaxial base layer on the auxiliary substrate comprises silicon germanium.

20. The method of claim 13, which further comprises transferring a combination of at least a portion of the additional epitaxial base layer together with at least a portion of the second epitaxial layer to another substrate.

* * * * *

UNITED STATES PATENT AND TRADEMARK OFFICE
CERTIFICATE OF CORRECTION

PATENT NO.        : 7,232,488 B2                                          Page 1 of 1
APPLICATION NO.   : 10/827437
DATED             : June 19, 2007
INVENTOR(S)       : Akatsu et al.

It is certified that error appears in the above-identified patent and that said Letters Patent is hereby corrected as shown below:

<u>Column 12</u>:
Line 28 (claim 18, line 1), delete "14" and insert -- 13 --.

Signed and Sealed this

Seventh Day of August, 2007

JON W. DUDAS
*Director of the United States Patent and Trademark Office*